(12) United States Patent
Leddige et al.

(10) Patent No.: US 6,366,466 B1
(45) Date of Patent: Apr. 2, 2002

(54) MULTI-LAYER PRINTED CIRCUIT BOARD WITH SIGNAL TRACES OF VARYING WIDTH

(75) Inventors: Michael W. Leddige, Beaverton; Bryce D. Horine, Aloha; James A. McCall, Beaverton, all of OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/524,450

(22) Filed: Mar. 14, 2000

(51) Int. Cl.[7] ............................. H05K 1/02; H05K 1/14
(52) U.S. Cl. .................. 361/760; 361/777; 361/736; 361/720; 257/775; 257/773; 174/261
(58) Field of Search ................... 361/760, 735, 361/746, 750, 790, 794, 795, 808, 777, 748; 257/632, 635, 637, 700, 774, 775, 773, 786; 439/66; 174/261, 262; 333/32, 33, 34, 246, 247

(56) References Cited

U.S. PATENT DOCUMENTS

| | | | |
|---|---|---|---|
| 3,033,914 A | 5/1962 | Acosta-Lleras | |
| 3,398,232 A | 8/1968 | Hoffman | |
| 4,064,357 A * | 12/1977 | Dixon et al. | 174/68.5 |
| 4,211,603 A * | 7/1980 | Reed | 156/659 |
| 4,258,468 A * | 3/1981 | Balde | 29/830 |
| 4,361,634 A * | 11/1982 | Miller | 430/5 |
| 5,272,600 A | 12/1993 | Carey | |
| 5,578,940 A | 11/1996 | Dillon et al. | |
| 5,608,591 A * | 3/1997 | Klaassen | 360/104 |
| 5,663,661 A | 9/1997 | Dillon et al. | |
| 5,764,489 A | 6/1998 | Leigh et al. | |
| 5,967,848 A * | 10/1999 | Johnson et al. | 439/620 |
| 6,021,076 A | 2/2000 | Woo et al. | |
| 6,067,594 A | 5/2000 | Perino et al. | |
| 6,137,709 A * | 10/2000 | Boaz et al. | 365/51 |
| 6,160,716 A | 12/2000 | Perino et al. | |
| 6,201,194 B1 * | 3/2001 | Lauffer et al. | 174/264 |

\* cited by examiner

Primary Examiner—Jayprakash N. Gandhi
Assistant Examiner—Hung Bui
(74) Attorney, Agent, or Firm—Mark V. Seeley

(57) ABSTRACT

A multi-layer printed circuit board that includes a first layer and a second layer that have first and second signal traces, respectively. The first signal trace has a relatively thin section and a relatively thick section. The multi-layer printed circuit board also includes a via that couples the first signal trace to the second signal trace. The first signal trace's relatively thin section is located between its relatively thick section and the via.

22 Claims, 4 Drawing Sheets

MULTI-LAYER PRINTED CIRCUIT BOARD WITH SIGNAL TRACES OF VARYING WIDTH

FIELD OF THE INVENTION

The present invention relates to electrical interconnects for printed circuit boards.

BACKGROUND OF THE INVENTION

When the space available for signal traces on printed circuit boards ("PCBs") is limited, the signal line for connecting components may have to be routed along more than one PCB layer. As shown in FIG. 1, the signal line may comprise first signal trace 1, which runs along first layer 2, that is connected by via 9 to second signal trace 4, which runs along second layer 5. Via 9 adds capacitance to the signal line. This lowers the line impedance at the via, which creates an impedance discontinuity for the signal line.

Although this may be a third or fourth order effect for relatively low speed interconnects, such discontinuities can effectively limit the maximum frequency at which high speed, pipelined electrical signals may be driven along a high speed interconnect. Take, for example, the Direct Rambus memory channel, which a PCB may include for transmitting 300 MHz, or higher, clock signals, in a pipelined fashion, between components mounted to the PCB. (Because data is taken off both the falling and rising edges of the clock signal, the data transfer rate may be 600 M transfers, or more.) At such frequencies, variations in the impedance of a signal line may cause the transmitted signals to be reflected, which can degrade their quality.

The Direct Rambus memory channel can require signals to pass through dozens of vias before reaching their ultimate destination. For example, for PCBs having two RIMMS, the Direct Rambus memory channel may require signals, which originate at the memory controller, to pass through 40 or more vias before reaching termination. When signals must pass through multiple vias, the signal reflection that accumulates over the length of the bus, resulting from the additive effect of the impedance discontinuities that those vias create, may impact system performance. To prevent such signal reflection from causing undesirable effects, the device may have to be operated at a reduced frequency.

Accordingly, there is a need for an improved interconnect for a printed circuit board. There is a need for such an interconnect that enables signals to pass from one PCB layer to another through a via without generating impedance discontinuities that may require signals to be transmitted through the interconnect at a reduced frequency. The present invention provides such an interconnect.

DETAILED DESCRIPTION OF THE PRESENT INVENTION

A multi-layer printed circuit board is described. That circuit board includes first and second layers that include first and second signal traces, respectively. In one aspect of the present invention, the first signal trace has a relatively thin section and a relatively thick section. The multi-layer printed circuit board includes a via that couples the first signal trace to the second signal trace. The first signal trace's relatively thin section is located between its relatively thick section and the via.

Several embodiments of the present invention are described below with reference to FIGS. 1–4. In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

Figures 2A, 2B:
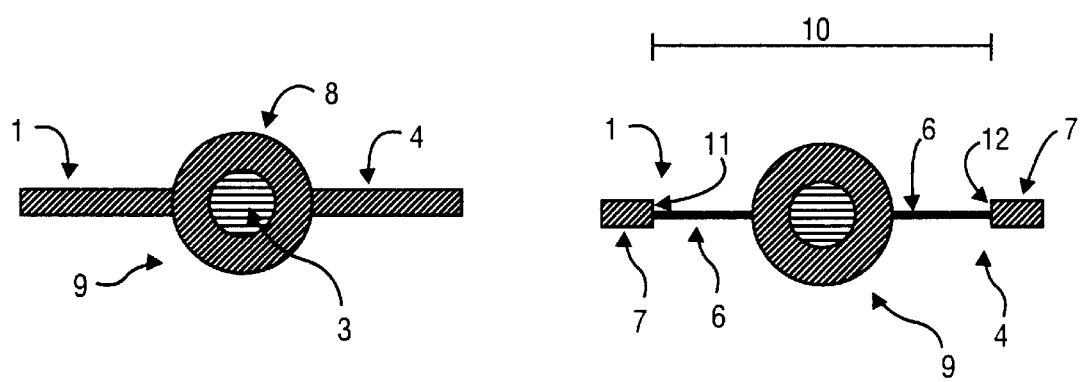
FIG. 2a represents an overhead view of the PCB that FIG. 1 illustrates.
FIG. 2b represents an overhead view of an embodiment of the present invention in which a signal trace includes a thin section that separates a relatively thick section from a via.

As shown in FIG. 2a, conventionally, signal trace 1 has a substantially constant width. (The figure shows traces 1 and 4 coupled to via 9, as that structure would appear if signal trace 4—located on lower layer 5—could be observed from the surface of the PCB.) Because via 9 adds capacitance to the signal line, the line impedance decreases at the via. Via 9 may lower the signal line impedance by adding between about 0.3 and about 0.7 picofarads of capacitance. (The term "via," as used herein, refers to the combination of shaft 3, which connects one signal trace to another, and pad 8, which couples trace 1 to shaft 3. In embodiments that do not include such a pad, the term "via" refers to the shaft that connects traces located on different PCB layers.) As mentioned above, the variation in impedance resulting from the via's presence causes signal reflection, which can impact the performance of signals transmitted over a high speed, pipelined interconnect.

To address this problem, the present invention raises the impedance of another portion of the signal line to compensate for the reduced impedance at the via. In the embodiment shown in FIG. 2b, this is accomplished by forming a signal trace 1, on upper PCB layer 2, and a signal trace 4, on lower PCB layer 5, that each include a relatively thin section 6 and a relatively thick section 7. (Like FIG. 2a, FIG. 2b shows traces 1 and 4 coupled to via 9, as that structure would appear if signal trace 4—located on lower layer 5—could be observed from the surface of the PCB.)

Thin section 6 provides a higher impedance than thick section 7. Consequently, the impedance resulting from the combination of thin section 6 and via 9 (e.g., the average signal line impedance between points 11 and 12, shown in FIG. 2b) will more closely match the impedance of thick section 7, than will the impedance at via 9 alone. In a preferred embodiment, a length and a thickness for thin section 6 are chosen such that the impedance resulting from the combination of thin section 6 and via 9 is within about 5% of the impedance of thick section 7. For example, in such a preferred embodiment, if the impedance of thick section 7 is 28 ohms, then the average impedance of section 10 of the signal line that extends from point 11 to point 12 will be between about 26.6 and about 29.4 ohms. To obtain that result, thick sections 7 preferably should be between about 0.012 and about 0.016 inches thick, while thin sections 6 preferably should be between about 0.004 and about 0.005 inches thick. Thin sections 6 should separate thick sections 7 from via 9 by a distance that ensures that the difference in impedance is less than about 5%.

When selecting an appropriate length and thickness for thin section 6 to balance the reduction in impedance that via 9 causes, a number of factors should be considered—such as, the impedance of thick section 7 and via 9, and the signal delay that thin section 6 introduces. The magnitude of via 9's contribution to impedance, due to the increased capacitance that via 9 generates, may depend upon the diameter of pad 8; the diameter and length of shaft 3; the PCB stack-up (e.g., the number of PCB layers and the thickness of those layers); and the anti-pad diameter. A length should be chosen for thin section 6 that does not add an unacceptable amount of electrical delay. In a preferred embodiment, the length chosen should ensure that the increased delay resulting from the combination of sections 6 and via 9 does not exceed one-half of the signal rise time ($T_R/2$).

When the average impedance from combining section 6 and via 9 is approximately equal to that of thick section 7, the portion 10 of the signal line that lies between points 11 and 12 may, for all practical purposes, be treated as an extension of thick section 7 of traces 1 and 4. Although inserting section 6 between section 7 and via 9 does not reduce the signal delay resulting from passing through via 9, matching the impedance of portion 10 with the impedance of section 7 can eliminate, or at least reduce, signal reflection from via 9, which may help maximize operating bandwidth.

Figure 3:
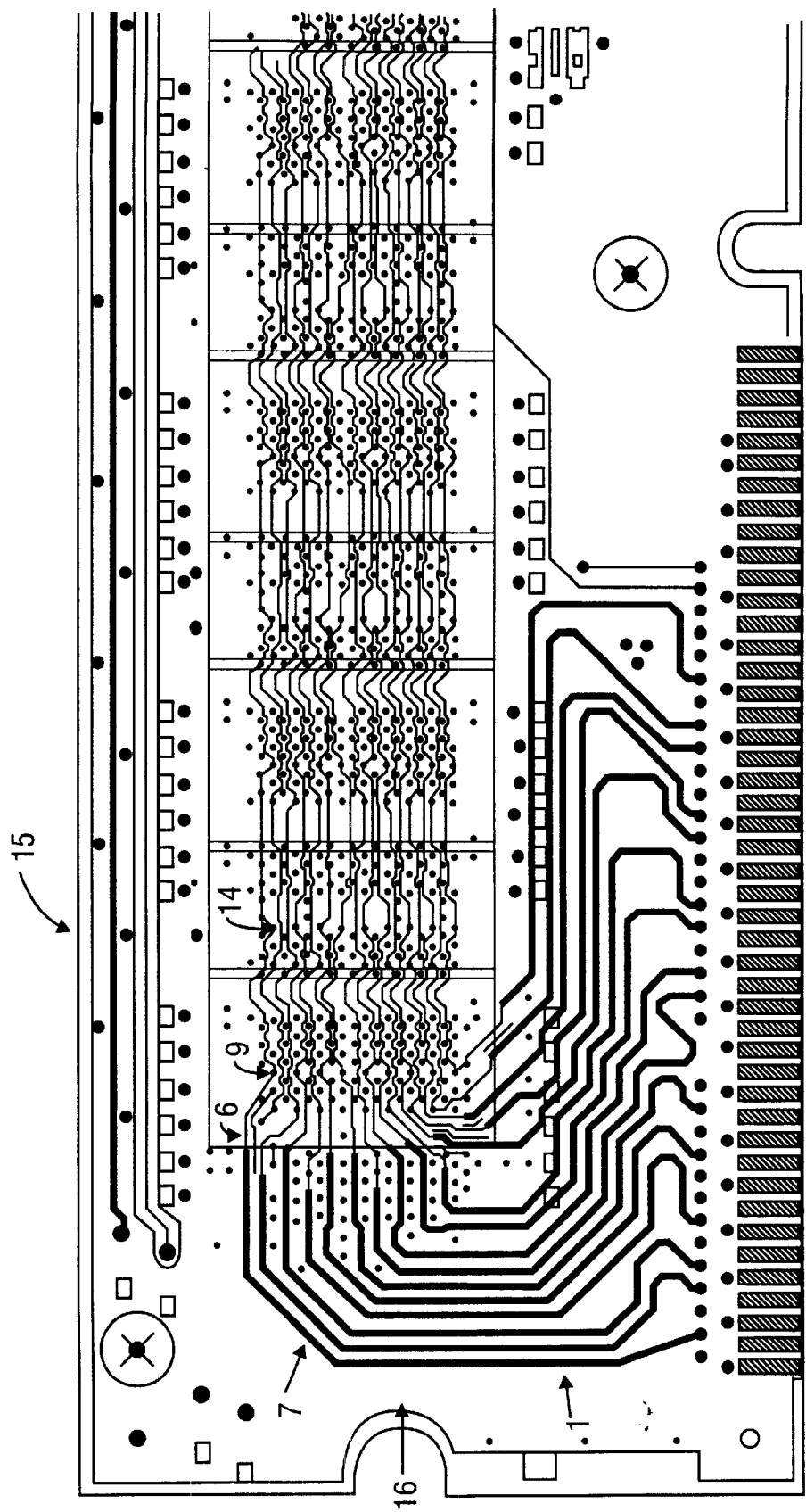
FIG. 3 illustrates an embodiment of the present invention as implemented in a memory card.

FIG. 3 illustrates an embodiment of the present invention as implemented in memory card 15 for a Direct Rambus memory channel. In this embodiment, thick sections 7 of signal traces 1 are coupled to vias 9 by thin sections 6. As shown, signal traces pass through multiple vias. In this embodiment, vias are optimally spaced such that the impedance resulting from the combination of adjoining vias and the thin sections connecting them matches the impedance of thick sections 7. Note, for example, that the combination of (1) via 9; (2) via 14; (3) thin section 6, which couples via 9 with thick section 7; and (4) the thin section that couples via 9 with via 14, generates an impedance that matches that of thick section 7.

In the embodiment shown in FIG. 3, vias are positioned from side 16 of memory card 15 to the other side (not shown) of memory card 15 such that the impedance resulting from the combination of the vias, and the links connecting them, matches the impedance of thick section 7. Consequently, the signal line running from thick sections 7 on side 16 to the corresponding thick sections of the signal line, which are formed on the other side of memory card 15 (not shown), use thin sections 6 exclusively to link the vias that are positioned along that path. In alternative embodiments (e.g., where vias are spaced further apart), thick sections of the signal trace may be inserted between the thin sections that are formed adjacent to linked vias, to provide a substantially uniform impedance across the signal line from one side of the memory card to the other.

Figure 4:
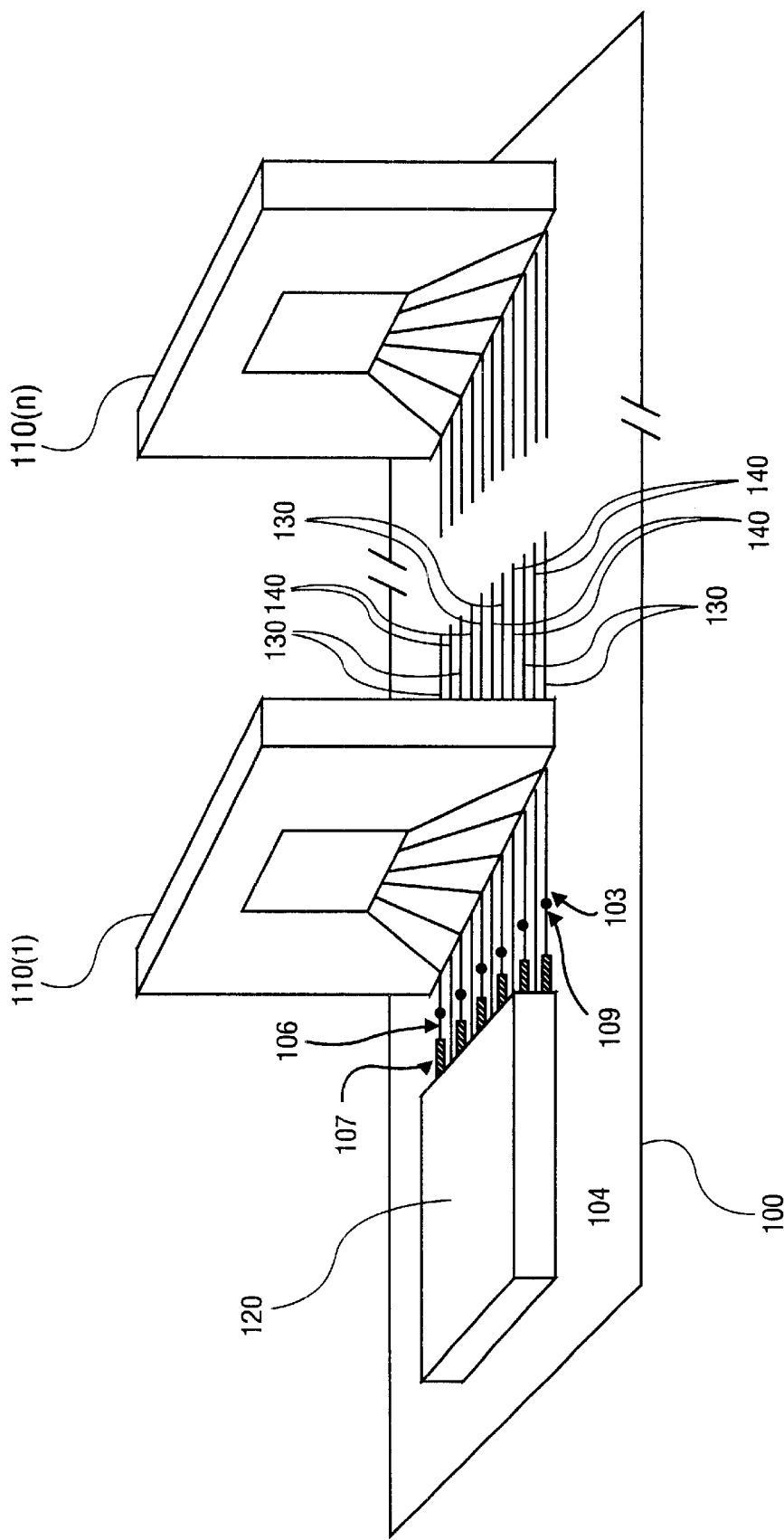
FIG. 4 illustrates an embodiment of the present invention as implemented in a motherboard.

FIG. 4 illustrates an embodiment of the present invention as implemented in a motherboard. Mounted onto motherboard 100 are memory controller 120 and memory modules 110(1)–110(n). Memory modules 110(1)–110(n) may comprise high speed DRAMs, e.g., those having an architecture developed by Rambus Corporation of Mountain View, California, which are generally designated Rambus DRAMS or RDRAMs. Such RDRAMs may be capable of transmitting and receiving clock signals at 300 MHz or more.

Motherboard 100 supports interconnect 103. A first portion of interconnect 103 is located on first layer 104. That first portion of interconnect 103 includes several signal traces 130 and several reference traces 140. Signal traces 130 have relatively thin sections 106 and relatively thick sections 107. A second portion of interconnect 103 is located on a second layer (not shown). That second portion of interconnect 103 also includes several signal and reference traces. Vias 109 couple signal traces 130 to signal traces located on the second layer. Like the structure shown in FIG. 2b, thin sections 106 of signal traces 130 may be located between thick sections 107 and vias 109 on both layer 104 and the second layer.

Motherboard 100 may comprise a four layer board in which the signal traces are located on a first layer that forms a first surface of the motherboard and on a second layer that forms a second surface of the motherboard. In such a four layer board, signal traces may be formed on upper and lower layers, while power and ground planes may be formed on layers located between the signal layers. Alternatively, the signal layers may be located on the interior layers and the power and ground planes located on the outer layers.

Motherboard 100 may comprise more than four layers. For an eight layer board, for example, layers may be stacked in the following order: signal layer, ground plane, signal layer, power plane, ground plane, signal layer, ground plane, signal layer. In such an eight layer board, the interconnect described above may be used to connect signal traces that are each formed on outer layers, or to connect a signal line formed on an outer layer with a signal line formed on an embedded layer, or to connect signal lines that are each formed on embedded layers.

Figure 1:
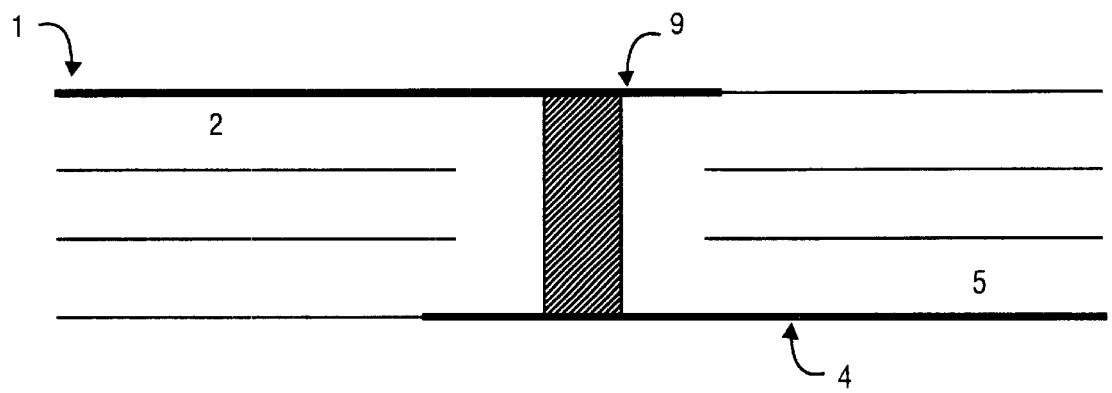
FIG. 1 represents a cross-section of a four layer PCB that routes signals from a first signal trace located on one of the layers to a second signal trace located on another layer.
Figure 5A:
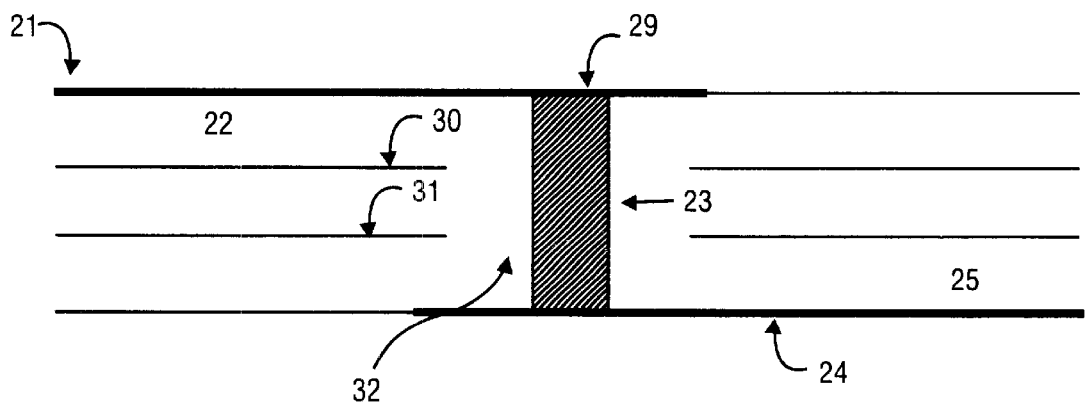
FIG. 5a represents a cross-section of a four layer PCB that routes signals from a first signal trace located on one of the layers to a second signal trace located on another layer.
Figure 5B:
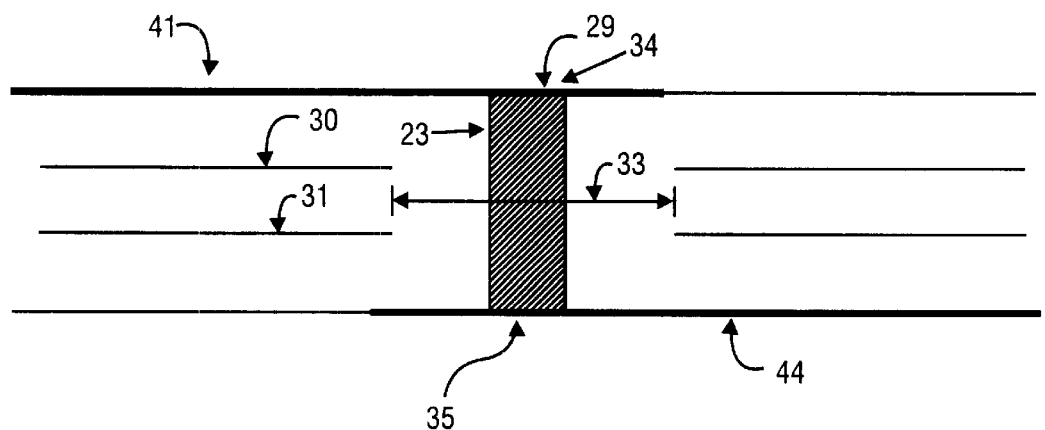
FIG. 5b represents a cross-section of an embodiment of the present invention in which the capacitance applied to a signal line at the via is lowered by increasing the spacing between the ground and power planes and the via shaft.

An alternative way to enable signals to pass from one PCB layer to another through a via without generating impedance discontinuities that may require signals to be transmitted through the interconnect at a reduced frequency is illustrated in FIGS. 5a and 5b. FIG. 5a, like FIG. 1, shows first signal trace 21, which runs along first layer 22, that is connected by via 29 to second signal trace 24, which runs along second layer 25. As explained above, via 29 adds capacitance to the signal line. The magnitude of that capacitance depends, in part, upon how closely ground and power planes 30 and 31 are located to shaft 23. The closer those planes are to shaft 23, the greater the capacitance. The farther those planes are from shaft 23, the lower the capacitance.

The diameter of cylinder 32, formed within unconnected ground and power planes 30 and 31, may be called the anti-pad diameter. That distance may be about 0.040 inches. One way to reduce the capacitance that via 29 applies to a signal line, is to increase anti-pad diameter 33, as shown in FIG. 5b. By reducing that capacitance, the impedance discontinuity that via 29 causes will also be reduced. In a preferred embodiment, anti-pad diameter 33 may be increased to between about 0.050 and about 0.080 inches. By increasing the anti-pad diameter, shaft 23 (which may have a diameter of between about 0.012 and about 0.016 inches) may be separated from ground and power planes 30 and 31 by at least about 0.040 inches. Such increased spacing may ensure that the capacitance that the combination of via pad 34, shaft 23, and via pad 35 will apply to a signal transmitted through via 29 will be less than about 0.2 picofarads. Such increased spacing may further ensure that the average impedance resulting from the combination of via pad 34, shaft 23 and via pad 35 is within about 5% of the impedance of first and second signal traces 41 and 44.

An improved interconnect for a printed circuit board has been described. That interconnect includes signal traces that have a relatively thin section, which separates a relatively thick section from a via that connects a first signal trace located on a first PCB layer to a second signal trace formed on another PCB layer. This may enable a signal line to maintain a substantially constant impedance, even when that signal line passes through the via.

Features shown in the above referenced drawings are not intended to be drawn to scale, nor are they intended to be shown in precise positional relationship. Additional features that may be integrated into the interconnect of the present invention have been omitted as they are not useful to describe aspects of the present invention. Although the foregoing description has specified an interconnect that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A multi-layer printed circuit board comprising:
   a first layer that includes a first signal trace having a relatively thin section and a relatively thick section as observed from above the printed circuit board;
   a second layer that includes a second signal trace; and
   a via that couples the first signal trace to the second signal trace;
   wherein the first signal trace's relatively thin section is located between its relatively thick section and the via.

2. The multi-layer printed circuit board of claim 1 wherein the relatively thick section is between 0.012 and 0.016 inches thick, and the relatively thin section is between 0.004 and 0.005 inches thick.

3. The multi-layer printed circuit board of claim 1 wherein the via adds between 0.3 and 0.7 picofarads of capacitance to the signal line.

4. The multi-layer printed circuit board of claim 1 wherein the via comprises a via pad and a shaft for coupling the first signal trace to the second signal trace.

5. The multi-layer printed circuit board of claim 4 wherein the thin section provides higher impedance than the thick section, which enables the average impedance of the combination of the thin section and the via to more closely match the impedance of the thick section, than does the impedance of the via.

6. The multi-layer printed circuit board of claim 1 wherein the second signal trace has a relatively thin section and a relatively thick section as observed from above the printed circuit board and wherein the relatively thin sections of the first and second signal traces separate the relatively thick sections of the first and second signal traces from the via to ensure that the average impedance resulting from the combination of those thin sections and the via is within 5% of the impedance of the thick sections.

7. The multi-layer printed circuit board of claim 6 wherein the average impedance of the combination of the thin sections and the via is substantially equal to the impedance of the thick sections.

8. The multi-layer printed circuit board of claim 7 wherein the signal propagation delay introduced by the combination of the thin sections and the via is less than or equal to one-half of the signal rise time.

9. The multi-layer printed circuit board of claim 1 wherein the first layer forms a first surface of the multi-layer printed circuit board and the second layer forms a second surface of the multi-layer printed circuit board.

10. The multi-layer printed circuit board of claim 1 wherein the second layer is embedded between the first layer and a third layer.

11. The multi-layer printed circuit board of claim 1 wherein the first and second layers are embedded between third and fourth layers.

12. A multi-layer printed circuit board comprising:
    a first layer that includes a first signal trace having a relatively thin section that is between 0.004 and 0.005 inches thick, and a relatively thick section that is between 0.012 and 0.016 inches thick;
    a second layer that includes a second signal trace having a relatively thin section that is between 0.004 and 0.005 inches thick, and a relatively thick section that is between 0.012 and 0.016 inches thick; and
    a via that couples the first signal trace to the second signal trace, the via adding capacitance to the signal line that extends from the first signal trace, through the via, to the second signal trace, which lowers the signal line impedance at the via;
    wherein the first and second signal trace's relatively thin sections are located between their relatively thick sections and the via such that the average impedance of the combination of those thin sections and the via more closely matches the impedance of the thick sections, than does the impedance of the via.

13. The multi-layer printed circuit board of claim 12 wherein the via comprises a via pad and a shaft for coupling the first signal trace to the second signal trace, and wherein the via adds between 0.3 and 0.7 picofarads of capacitance to the signal line.

14. The multi-layer printed circuit board of claim 13 wherein the signal propagation delay introduced by the combination of the thin sections and the via is less than or equal to one-half of the signal rise time.

15. A motherboard assembly comprising:
    a memory controller;
    a dynamic random access memory;
    a first layer that includes a first signal trace having a relatively thin section and a relatively thick section as observed from above the first layer;
    a second layer that includes a second signal trace; and
    a via that couples the first signal trace to the second signal trace;
    wherein the first signal trace's relatively thin section is located between its relatively thick section and the via.

16. The motherboard assembly of claim 15 wherein the relatively thick section is between 0.012 and 0.016 inches thick, and the relatively thin section is between 0.004 and 0.005 inches thick.

17. The motherboard assembly of claim 15 wherein the via comprises a via pad and a shaft for coupling the first signal trace to the second signal trace, and wherein the via adds between 0.3 and 0.7 picofarads of capacitance to the signal line.

18. The motherboard assembly of claim 17 wherein the thin section provides higher impedance than the thick section, which enables the average impedance of the combination of the thin section and the via to more closely match the impedance of the thick section, than does the impedance of the via.

19. The motherboard assembly of claim 18 wherein the second signal trace has a relatively thin section and a relatively thick section as observed from above the second layer and wherein the relatively thin sections of the first and second signal traces separate the relatively thick sections of the first and second signal traces from the via to ensure that the average impedance of the combination of the thin sections and the via is substantially equal to the impedance of the thick sections.

20. A multi-layer printed circuit board comprising:
 a first layer that includes a first signal trace;
 a second layer that includes a second signal trace;
 a third layer that includes a ground plane; and
 a via, having a via pad and a shaft, that couples the first signal trace to the second signal trace;
 wherein the shaft is separated from the ground plane by at least 0.040 inches.

21. The multi-layer printed circuit board of claim 20 wherein the via pad engages the first signal trace and wherein the via further comprises a second via pad that engages the second signal trace; and wherein the combination of the via pad, the shaft and the second via pad, will apply a capacitance of less than 0.2 picofarads to a signal transmitted through the via.

22. The multi-layer printed circuit board of claim 20 wherein the ground plane is separated from the shaft by a sufficient distance to ensure that the average impedance resulting from the combination of the via pad, the shaft and the second via pad is within 5% of the impedance of the first and second signal traces.

* * * * *